US009514810B1

(12) United States Patent
Sadd et al.

(10) Patent No.: US 9,514,810 B1
(45) Date of Patent: Dec. 6, 2016

(54) RESISTIVE NON-VOLATILE MEMORY CELL AND METHOD FOR PROGRAMMING SAME

(71) Applicant: FREESCALE SEMICONDUCTOR, INC., Austin, TX (US)

(72) Inventors: Michael A. Sadd, Austin, TX (US); Anirban Roy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/018,095

(22) Filed: Feb. 8, 2016

(51) Int. Cl.
*G11C 11/00* (2006.01)
*G11C 13/00* (2006.01)

(52) U.S. Cl.
CPC ....... *G11C 13/0023* (2013.01); *G11C 13/0002* (2013.01); *G11C 13/004* (2013.01); *G11C 13/0069* (2013.01); *G11C 13/0004* (2013.01)

(58) Field of Classification Search
CPC ............... G11C 13/004; G11C 13/0007; G11C 13/0002; G11C 13/0069; G11C 13/0004
USPC ................... 365/148, 100, 190.09, 149, 205
See application file for complete search history.

(56) References Cited

U.S. PATENT DOCUMENTS

| | | |
|---|---|---|
| 6,191,989 B1 | 2/2001 | Luk et al. |
| 6,816,403 B1 | 11/2004 | Brennan et al. |
| 8,027,206 B2 | 9/2011 | Yoon et al. |
| 8,194,439 B2 | 6/2012 | Kim et al. |
| 8,509,003 B2 | 8/2013 | Lin et al. |
| 8,687,412 B2 | 4/2014 | Chih et al. |
| 9,245,609 B2 * | 1/2016 | Aoki .................. G11C 11/1653 |
| 2011/0122674 A1 | 5/2011 | Lin et al. |
| 2014/0211550 A1 | 7/2014 | Sun et al. |

OTHER PUBLICATIONS

Aoki, Masaki et al: "A Novel Voltage Sensing 1T/2MTJ Cell with Resistance Ratio for Highly Stable and Scalable MRAM", 2005 Symposium on VLSI Circuits Digest of Technical Papers, Jun. 16-18, 2005, IEEE, pp. 170-171.
Chen, Yiran et al: "A Nondestructive Self-Reference Scheme for Spin-Transfer Torque Random Access Memory (STT-RAM)", Design, Automation & Test in Europe Conference & Exhibition (Date), Mar. 8-12, 2010, Dresden, IEEE, pp. 148-153.
Huang, Kejie et al: "Optimization Scheme to Minimize Reference Resistance Distribution of Spin-Transfer-Torque MRAM", IEEE Transactions on Very Large Scale Integration (VLSI) Systems, vol. 22, No. 5, May 2014, pp. 1179-1182.

(Continued)

*Primary Examiner* — David Lam

(57) ABSTRACT

A memory has a word line, a bit line, a plurality of resistive non-volatile memory (RNVM) cells coupled to the word line, and a first source line and a second source line. A first RNVM cell of the plurality of RNVM cells includes a first RNVM element having a first terminal coupled to a common node and a second terminal coupled to the first source line. A second RNVM element has a first terminal coupled to the first RNVM element at the common node and a second terminal coupled to the second source line. The coupling transistor is coupled to the word line, the bit line, and the common node that couples the common node to the bit line during sensing. A sense amplifier is capacitively coupled to the bit line to read a logic state of the first RNVM cell during sensing.

20 Claims, 4 Drawing Sheets

(56) References Cited

OTHER PUBLICATIONS

Na, Taehui et al: "Reference-Scheme Study and Novel Reference Scheme for Deep Submicrometer STT-RAM", IEEE Transactions on Circuits and Systems—I: Regular Papers, vol. 61, No. 12, Dec. 2014, pp, 3376-3385.
Smullen, Clinton W.: "Designing Giga-scaleMemory Systems with STT-RAM", Presented to the Faculty of the School of Engineering and Applied Science University of Virginia, Dec. 2011, pp. 1-158.
Tsuchida Kenji et al: "A 64Mb MRAM with Clamped-Reference and Adequate-Reference Schemes", ISSCC 2010 / Session 14 / Non-Volatile Memory / 14.2, 2010 IEEE International Solid-State Circuits Conference, pp. 258-260.
Xu, Wei et al: "Design of Spin-Torque Transfer Magnetoresistive RAM and CAM/TCAM with High Sensing and Search Speed", IEEE Transactions on Very Large Scale Integration (VLSI) Systems, vol. 18, No. 1, Jan. 2010, pp, 66-74.
Yu, Hung-Chang et al: "New Circuit Design Architecture for a 300-MHz 40nm 1Mb Embedded STT-MRAM with Great Immunity to PVT Variation", 2012 International Conference on Solid-State and Integrated Circuit (ICSIC 2012) IPCSIT vol. 32 (2011) © (2011) IACSIT Press, Singapore, pp. 57-61.
Zhang, Li et al: "Design and analysis of the reference cells for STT-MRAM", Article in IEICE Electronics Express, Jan. 2013, Impact Factor: 0.32 • DOI: 10.1587/elex.10.20130352, IEICE Electronics Express, vol. 10, No. 12, 1-6, pp. 1-8.

\* cited by examiner

RESISTIVE NON-VOLATILE MEMORY CELL AND METHOD FOR PROGRAMMING SAME

BACKGROUND

1. Field

This disclosure relates generally to electronic circuits and more specifically to a resistive non-volatile memory (RNVM).

2. Related Art

Non-volatile memories retain their stored states when power is removed, and have become important in a number of applications. However, typically, non-volatile memories have characteristics that make them difficult to use, such as slow program and erase operations, inability to erase one bit at a time, and high voltage requirements for programming. Some resistive non-volatile memories overcome these difficulties, such as magnetic random access memory (MRAM), making MRAM a candidate for use as a random access memory. MRAM stores a memory state by changing a resistance of a resistive element called a magnetic tunnel junction (MTJ). One problem with MRAM is that the difference in resistance between a low state and a high state may be very small, making it difficult to reliably sense the stored state. Variation in resistance values across an array, caused by for example, layout, process, and temperature changes, may be significant. The resistance variation across the MTJs of the array may be large enough to cause a sensed voltage across the MTJ to overlap a fixed reference voltage, making sensing the stored state impossible.

Therefore, a need exists for a RNVM that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
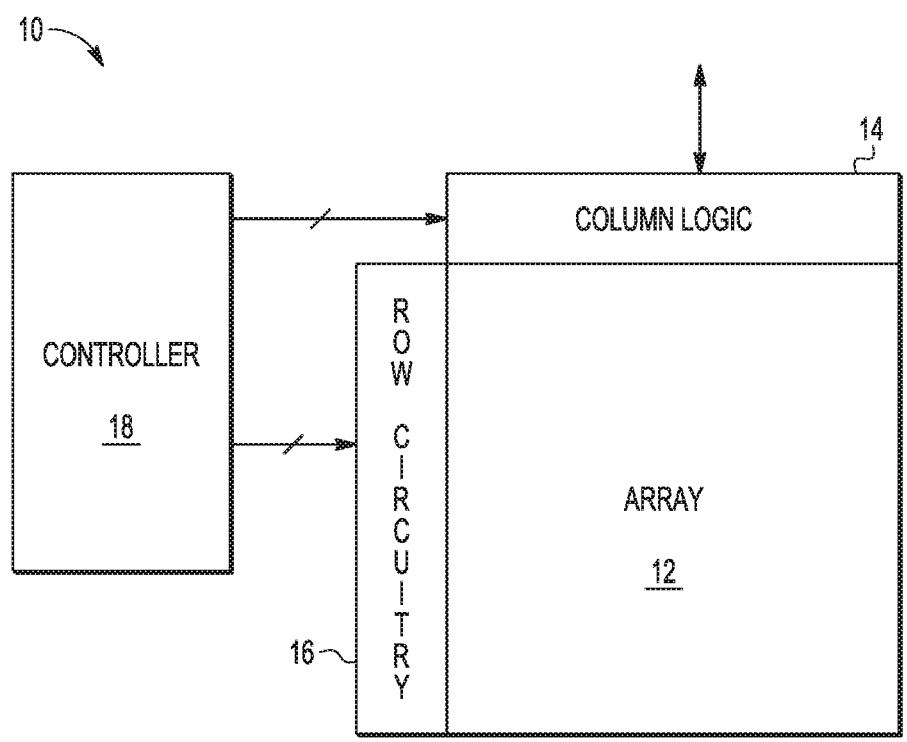
FIG. 1 illustrates, in block diagram form, a non-volatile memory in accordance with an embodiment.

Generally, there is provided, a RNVM and a method for reading the RNVM. Each memory cell of a RNVM array includes an access transistor and two resistive elements. In one embodiment, the resistive elements are MTJs. The MTJ elements are coupled in series between a high source line and a low source line. The access transistor has a first source/drain terminal coupled to a bit line and a second source/drain terminal coupled between the two MTJ elements. In a programmed memory cell, one MTJ element has a relatively high resistance and the other MTJ element has a lower resistance. A capacitor and a sense amplifier are coupled to the bit line. A read operation of the programmed memory cell includes a calibrate phase and a sense phase. During the calibrate phase, both source lines and the bit line are precharged to a reference voltage level and the sense amplifier is calibrated to a trip voltage level by shorting the sense amplifier input and output together. The sense phase follows the calibrate phase. During the sense phase, the sense amplifier short circuit is removed, or opened, and a voltage offset is added to the reference voltage on one source line and subtracted from the reference voltage on the other source line. A change in voltage caused by the different programmed resistance values of the MTJ elements is sensed by the sense amplifier through the capacitor. The resistive non-volatile memory cell and method for reading nulls amplifier offset voltages resulting in more reliable read operations. Using one access transistor with two MTJ elements provides a more compact memory cell than a conventional array having two memory cells to provide differential sensing.

In one embodiment, there is provided, a memory comprising: a plurality of bit lines and word lines including a first word line and a first bit line; an array of resistive non-volatile memory (RNVM) cells divided into a plurality of segments including a first segment coupled to the first word line, a first source line, and a second source line, wherein: each RNVM cell of the first segment is coupled to the first word line, the first source line, and the second source line; the first segment includes a first RNVM cell comprising a coupling transistor having a first current electrode coupled to a first bit line of the plurality of bit lines, a first RNVM element, and a second RNVM element having a first terminal coupled to a first terminal of the first RNVM element; the coupling transistor has a second current electrode coupled to the first terminals of the first and second RNVM elements; the first RNVM element having a second terminal coupled to the first source line; and the second RNVM element having a second terminal coupled to the second source line; and a sense amplifier having a capacitive input coupled to the first bit line. The sense amplifier may comprise: a first capacitor having a first terminal coupled to the first bit line; a first inverting amplifier having an input coupled to a second terminal of the first capacitor; and a first coupling device coupled between an output of the first inverting amplifier and the input of the first inverting amplifier. A read operation of the memory may have a calibration phase and a sense phase, wherein during the calibration phase the first coupling device couples the input of the first inverting amplifier to the output of the first inverting amplifier, and during the sense phase the coupling device decouples the input of the first inverting amplifier from the output of the first inverting amplifier. The read operation of the memory may comprise a calibration phase and sense phase, wherein the first and second source lines have a first voltage relationship during the calibration phase and a second voltage relationship during a sense phase, wherein: the first relationship comprises one of a group consisting of the first and the second source lines are at a first voltage and the first source line is at a lesser voltage than the second source line; and the second relationship comprises the first source line is at a greater voltage than the second source line. During the calibration phase, the first and second source lines and the first bit line may be at a common voltage. The first source line may be at a lesser voltage than the second source line during the calibration phase; and the lesser voltage applied during the calibration phase may be the same amount less than the first voltage is greater than the second source line in the sense phase. The first word line may be enabled during the calibration phase and during the sense phase. The first RNVM cell may be programmed to a first logic state by applying a high voltage programming voltage to the first and second source lines while applying a low voltage programming voltage to the first bit line while the coupling transistor is enabled in response to the first word line being enabled. The first RNVM cell may be programmed to a second logic state by applying the low voltage programming voltage to the first and second source lines while applying the high voltage programming voltage to the first bit line while the coupling transistor is enabled in response to the first word line being enabled. The first and second RNVM elements may comprise magnetic tunnel junctions in which program current flowing from the first terminal to the second terminal in the first RNVM element increases resistance of the first RNVM element and program current flowing from the first terminal to the second terminal of the second RNVM element decreases resistance of the second RNVM element. Voltages may be supplied to the first and second source lines in response to the word line being enabled.

In another embodiment, there is provided, a method of operating a memory in which the memory comprises a word line, a bit line, a plurality of resistive non-volatile memory (RNVM) cells coupled to the word line, a first source line, and a second source line, wherein a first RNVM cell of the plurality of RNVM cells comprises a first RNVM element having a first terminal coupled to a common node, a second RNVM element having a first terminal coupled to the first RNVM element at the common node, and a coupling transistor coupled to the word line, the bit line, and the common node, the method comprising: performing calibration on the first RNVM cell by applying a predetermined voltage condition on a second terminal of the first RNVM element, a second terminal of the second RNVM element, and the common node; performing sensing on the first RNVM cell by applying a voltage differential across the second terminals of the first and second RNVM elements and using capacitive coupling to sense a change in voltage on the bit line to determine a logic state of the RNVM cell. The predetermined voltage condition may define a first polarity across the second terminals of the first and second RNVM elements and the applying the voltage differential across the second terminals may establish a voltage differential of a polarity opposite the first polarity. The predetermined voltage condition may define a first voltage differential between the second terminals of a first magnitude and the voltage differential of a polarity opposite the first polarity may be established at the first magnitude. The voltage differential of the first magnitude may provide a probability of programming that is lower than 1 in 10 to the twentieth. The step of performing the calibration may comprise applying a common voltage to the common node and the second terminals of the first and second RNVM elements. The step of performing the sensing may comprise: achieving a trip point condition on an inverting amplifier; and capacitively coupling the change in a bit line voltage to the inverting amplifier. The step of performing the calibration may be in response to the word line being enabled and the performing the sensing is while the word line remains enabled.

In yet another embodiment, there is provided, a memory comprising: a word line; a bit line; a plurality of resistive non-volatile memory (RNVM) cells coupled to the word line; a first source line and a second source line; wherein a first RNVM cell of the plurality of RNVM cells comprises: a first RNVM element having a first terminal coupled to a common node and a second terminal coupled to the first source line; a second RNVM element having a first terminal coupled to the first RNVM element at the common node and a second terminal coupled to the second source line; and a coupling transistor coupled to the word line, the bit line, and the common node that couples the common node to the bit line during sensing; and a sense amplifier capacitively coupled to the bit line to read a logic state of the first RNVM cell during sensing. The sense amplifier may comprise a capacitor coupled to the bit line, an inverting amplifier coupled to the capacitor, and a coupling device that establishes a trip point for the inverting amplifier.

Figure 2:
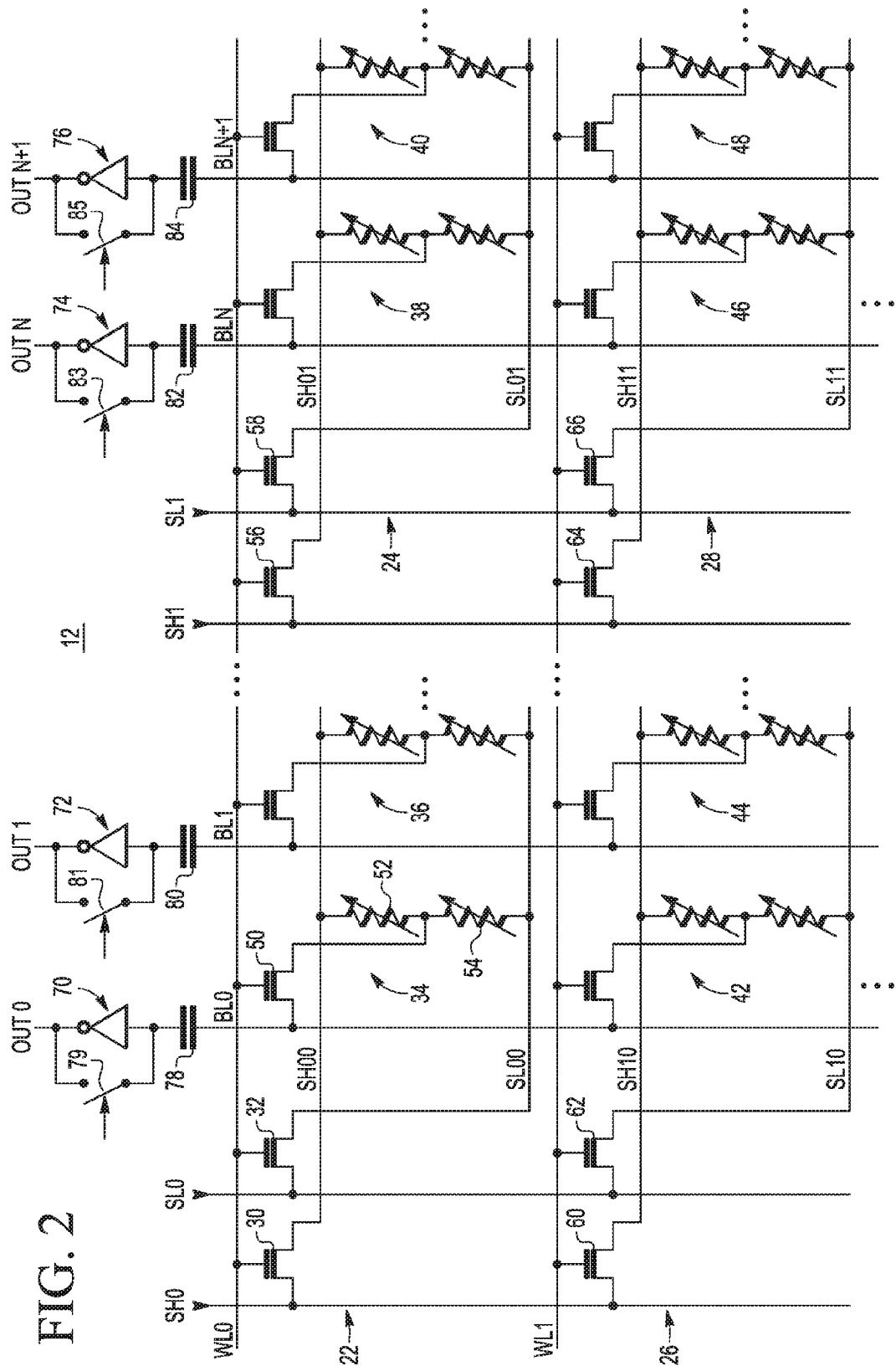
FIG. 2 illustrates, in schematic diagram form, an array of resistive non-volatile memory cells of the non-volatile memory of FIG. 1.

FIG. 1 illustrates, in block diagram form, a simplified view of RNVM 10 in accordance with an embodiment. Resistive non-volatile memory 10 includes array of memory cells 12, column logic 14, row circuitry 16, and controller 18. Array of memory cells 12 includes a plurality of MRAM cells organized in rows and columns. A row of memory cells includes a word line and all of the memory cells coupled to the word line. In the embodiment of FIG. 2, a row is divided into segments having a word line segment and the memory cells coupled to the word line segment. In FIG. 1, a column of memory cells includes a bit line and all of the memory cells coupled to the bit line. Row circuitry 16 is coupled to the word lines and provides row decoders and word line drivers for selecting and driving a selected word line or word line segment. Column logic 14 is coupled to the bit lines and includes column decoders and input/output circuits. The column decoders select one or more bit lines and the input/output circuits provides data signals from selected memory cells to be read, or receives data signals to be programmed into selected memory cells. Controller 18 provides control and address information to column logic 14 and row circuitry 16 for controlling the operation of memory 10. In other embodiments, controller 18 may be implemented separately from memory 10. For example, controller 18 may be part of a processor coupled to RNVM 10.

FIG. 2 illustrates, in schematic diagram form, array of RNVM cells 12 of RNVM 10 of FIG. 1. Array 12 includes a plurality of memory cells, such as representative memory cells 34, 36, 38, 40, 42, 44, 46, and 48. Each memory cell includes one access, or coupling, transistor and two resistive elements. Representative memory cell 34 includes access, or coupling, N-channel transistor 50 and resistive elements 52 and 54. In one embodiment, resistive elements 52 and 54 are magnetic tunnel junction (MTJ) resistive elements having a variable resistance and coupled together similarly to a voltage divider. Either resistive element can have a high resistance state or a low resistance state. The high resistance state and low resistance state of the two resistive elements are typically used to store a bit of data.

In memory cell 34, access N-channel transistor 50 has a gate connected to a word line labeled "WL0", a first source/drain terminal connected to a bit line labeled "BL0", and a second source/drain terminal. Resistive elements 52 and 54 form a voltage divider. Resistive element 52 has a first terminal connected to a high source line labeled "SH00", and a second terminal connected to the second source/drain terminal of access transistor 50. Resistive element 54 has a first terminal connected to the second terminal of resistive element 52, and a second terminal connected to a low source line labeled "SL00". All of the other illustrated memory cells 36, 38, 40, 42, 44, 46, and 48 are connected similarly.

In array 12, a row is divided to multiple segments. The use of multiple word line segments limits current draw during a read. For example, a segment 22 includes N-channel transistors 30 and 32, and memory cells 34 and 36 connected to word line WL0 and source lines SH00 and SL00. A segment 24 includes N-channel transistors 56 and 58, and memory cells 38 and 40 connected to word line WL0 and source lines SH01 and SL01. A segment 26 includes N-channel transistors 60 and 62, and memory cells 42 and 44 connected to word line WL1 and source lines SH10 and SL10. A segment 28 includes N-channel transistors 64 and 66, and memory cells 46 and 48 connected to word line WL1 and source lines SH11 and SL11. N-channel transistor 30 has a gate connected to word line WL0, a first source/drain terminal connected to receive a high reference voltage labeled "SH0", and a second source/drain terminal connected to the one resistive element of the pair of resistive elements of each memory cell of segment 22. Likewise, N-channel transistor 32 has a gate connected to word line WL0, a first source/drain terminal connected to receive a low reference voltage SL0, and a second source/drain terminal connected to the other one of the two resistive elements of the pair of resistive elements of each memory of segment 22.

Array 12 includes inverters 70, 72, 74, and 76, capacitors 78, 80, 82, and 84, and switches 79, 81, 83, and 85. A series-connected inverter and capacitor are coupled to each bit line. The inverters function as sense amplifiers. In another embodiment, the sense amplifiers may be implemented differently. A switch is connected between the input and output of each inverter. For example, capacitor 78 has a first terminal connected to bit line BL0, and a second terminal. Inverter 70 has an input terminal connected to the second terminal of capacitor 78, and an output terminal for providing an output data bit labeled "OUT 0". Switch 79 has a first terminal connected to the second terminal of capacitor 78, a second terminal connected to the output terminal of inverter 70, and a control terminal for receiving a control signal for operating switch 79. Capacitor 80 has a first terminal coupled to bit line BL1, and a second terminal. Inverter 72 has an input terminal connected to the second terminal of capacitor 80, and an output terminal for providing an output data bit labeled "OUT 1". Switch 81 has a first terminal connected to the second terminal of capacitor 80, a second terminal connected to the output terminal of inverter 72, and a control terminal for receiving a control signal for operating switch 81. Capacitor 82 has a first terminal coupled to bit line BLN, and a second terminal. Inverter 74 has an input terminal connected to the second terminal of capacitor 82, and an output terminal for providing an output data bit labeled "OUT N". Switch 83 has a first terminal connected to the second terminal of capacitor 82, a second terminal connected to the output terminal of inverter 74, and a control terminal for receiving a control signal for operating switch 83. Capacitor 84 has a first terminal coupled to bit line BLN+1, and a second terminal. Inverter 76 has an input terminal connected to the second terminal of capacitor 84, and an output terminal for providing an output data bit labeled "OUT N+1". Switch 85 has a first terminal connected to the second terminal of capacitor 78, a second terminal connected to the output terminal of inverter 70, and a control terminal for receiving a control signal for operating switch 85. In one embodiment, switches 79, 81, 83, and 85 are implemented as transmission gates having parallel-connected N-channel and P channel transistors.

A bit is programmed into a cell by changing a resistance of the MTJs. For example, RNVM cell 34 is programmed to a first logic state by applying a high voltage programming voltage to the first and second source lines while applying a low voltage programming voltage to the first bit line while the coupling transistor is enabled in response to the first word line being enabled. Likewise, RNVM cell 34 is programmed to a second logic state by applying the low voltage programming voltage to the first and second source lines while applying the high voltage programming voltage to the first bit line while the coupling transistor is enabled in response to the first word line being enabled.

Figure 3:
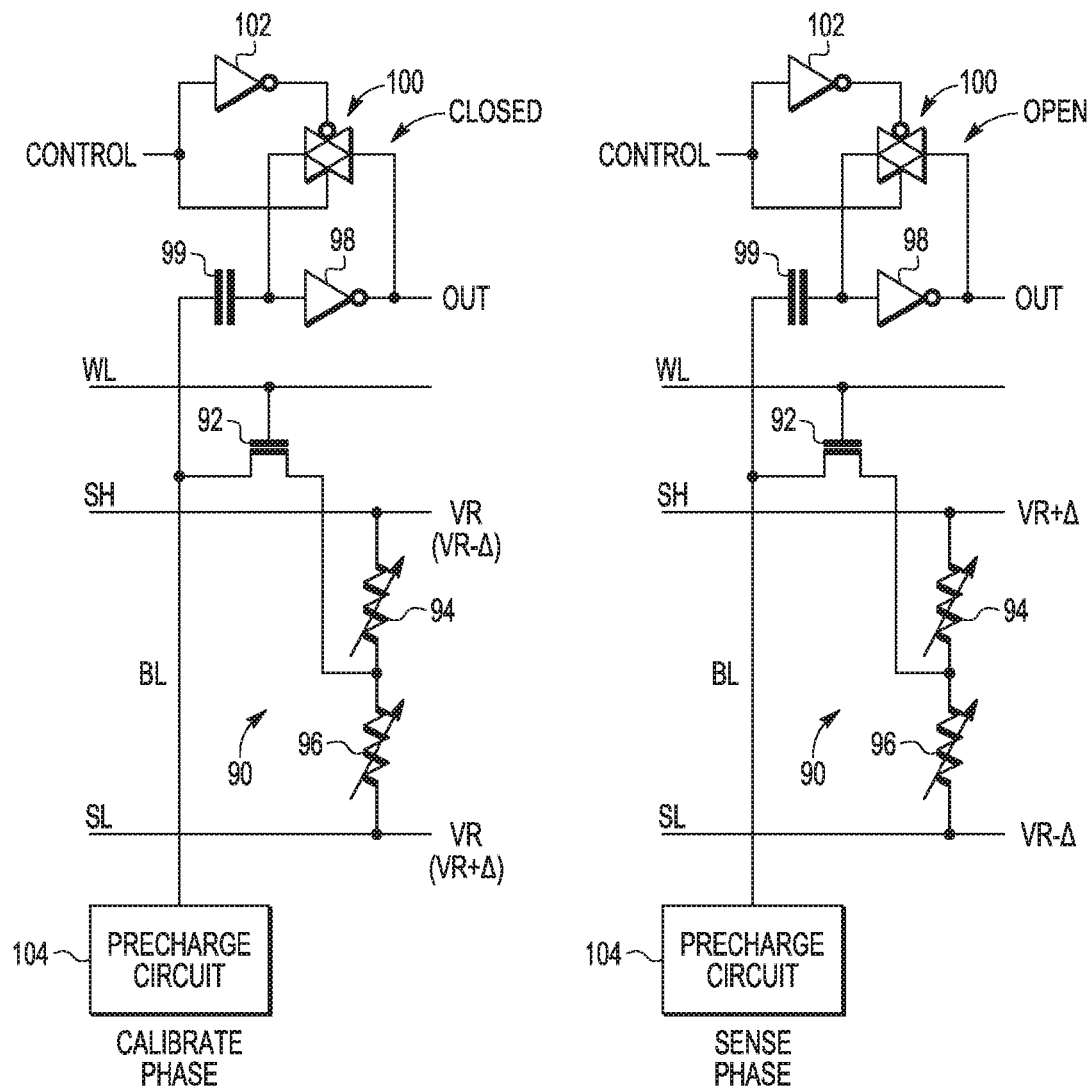
FIG. 3 illustrates a method for reading a memory cell of the array of FIG. 2 in accordance with an embodiment.

FIG. 3 illustrates a method for reading a memory cell of the array of FIG. 2 in accordance with an embodiment. The method for reading is illustrated using an exemplary memory array portion having an RNVM cell 90 coupled to source lines SH and SL, bit line BL, word line WL, and reference lines VR. RNVM cell 90 includes access transistor 92, and resistive elements 94 and 96. Capacitor 99 is connected to one end of bit line BL and to and input of inverter 98. A precharge circuit 104 is coupled to the other end of bit line BL for precharging the bit line during the CALIBRATE PHASE. Transmission gate 100 is connected to the input and an output of inverter 98 and controlled by control signal CONTROL. An inverter 102 is used to invert control signal CONTROL so that the P-channel transistor portion of transmission gate 100 becomes conductive and non-conductive during the same phase of control signal CONTROL. Transmission gate 100 illustrates one type of switch that can be used for each of switches 79, 81, 83, and 85 of FIG. 2.

As can be seen in FIG. 3, the method for reading includes two phases: a CALIBRATE PHASE and a SENSE PHASE. The CALIBRATE PHASE is used to initialize, or precharge, the bit line and the resistive elements of a selected cell in response to a control signal. That is, both source lines and the bit line are precharged to a reference voltage level VR. During the CALIBRATE PHASE, transmission gate 100 is closed, setting, or precharging, the sense amplifier to a trip voltage level by shorting the sense amplifier input and output together. During the SENSE PHASE, transmission gate 100 is opened, removing the short circuit across inverter 98. A voltage offset ($\Delta$) is added to the reference voltage VR on one source line and subtracted from the reference voltage VR on the other source line. A change in the voltage magnitude caused by the different programmed resistance values of the MTJ elements 94 and 96 is sensed by the sense amplifier 98 through the capacitor 99 and a corresponding data bit OUT is provided. Note that in another embodiment, during the CALIBRATE PHASE, instead of precharging both the high source line SH and the low source line SL to a common voltage VR, the high source line SH may be precharged to VR–$\Delta$ while the low source line SL may be precharged to VR+$\Delta$. Using the offset voltage $\Delta$ in this way may provide a greater voltage magnitude difference between a sensed logic high and a sensed logic low voltage by the sense amplifier. The predetermined voltage condition defines a predetermined polarity across the terminals of the RNVM elements 94 and 96 and the applying the predetermined polarity across the terminals establishes a voltage differential of a polarity opposite the predetermined polarity. In one embodiment, FIG. 3 illustrates the predetermined condition may include providing VR on a second terminal of the first RNVM element, a second terminal of the second RNVM element, and the common node between the first and second RNVM elements. In another embodiment, the predetermined condition may include providing a voltage VR–$\Delta$ to one terminal of the first RNVM element and a voltage VR+$\Delta$ to one terminal of the second RNVM element, so that a common node voltage is equal to about VR+$\Delta$(R94–R96)/(R94+R96), where R94 is the resistance of MTJ element 94 and R96 is the resistance of MTJ element 96. In this embodiment, the bit line is not driven by precharge circuit 104 during the CALIBRATE PHASE, but the bit line voltage is equal to approximately the common node voltage because transistor 92 is conductive. By way of example, for a 1 volt power supply voltage, VR may be in a range of about 0.2-0.4 volts and offset $\Delta$ may be in a range of about 50-100 millivolts (mV). Other voltages may be used in other embodiments, depending on, for example, process and circuit differences.

Figure 4:
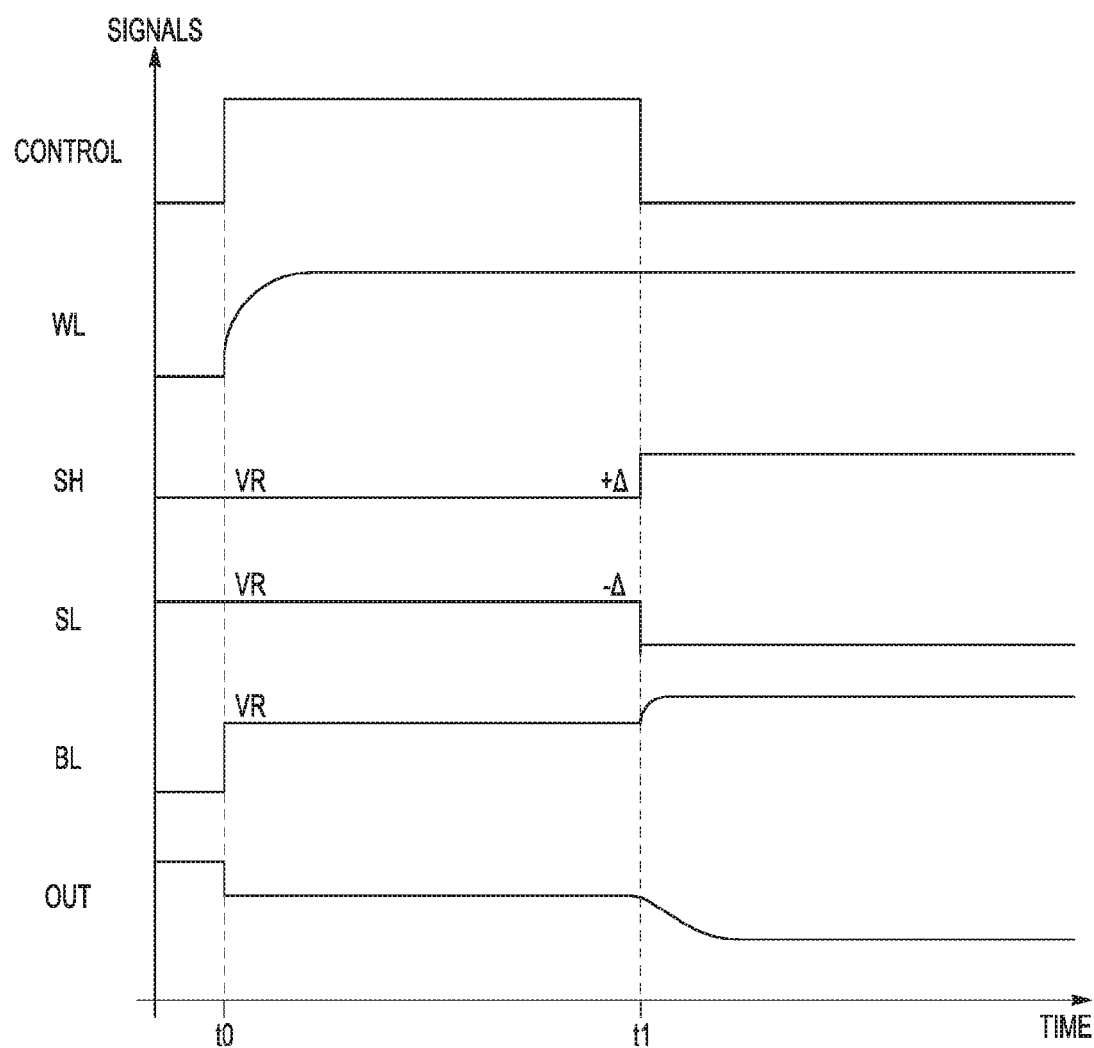
FIG. 4 illustrates a timing diagram of various signals used for a read operation of the memory.

FIG. 4 illustrates a timing diagram of various signals used for the two phases of a read operation of the RNVM. As described above, the two phases of a read operation include the calibrate phase and the sense phase. The timing diagram of FIG. 4 will be discussed with reference to FIG. 3. In FIG. 4, the calibrate phase of a read operation is illustrated in FIG. 4 between times t0 and t1. The sense phase is after time t1. At time t0, control signal CONTROL is asserted as a logic high and a selected word line is asserted as a logic high. A logic high control signal CONTROL causes a short circuit between the input and output of the sense amplifier, such as illustrated in FIG. 3 and discussed above. The logic high word line WL causes select transistor 92 of the selected memory cell to be conductive. Reference voltage VR is provided on the bit line BL by precharge circuit 104 to set the bit line voltage to an intermediate voltage level. When select transistor 92 is conductive, reference voltage VR is provided to a node between resistive elements 94 and 96. Also, source lines SH and SL are precharged with reference voltage VR. At time t1, the calibrate phase ends and the sense phase begins when control signal CONTROL returns to a logic low. During the sense phase, select transistor 92 is still conductive, coupling resistive elements 94 and 96 to bit line BL. An offset voltage ($\Delta$) is added to high source line SH and subtracted from low source line SL. Based on the relative resistance value of resistive elements 94 and 96, the voltage at the center node between resistive elements will swing one way or the other. In the illustrated embodiment, the relative resistance value cause the voltage on bit line BL to increase, indicating that memory cell 90 is storing a logic high. The change in voltage on bit line BL is sensed by capacitor 99 and inverter 98 and outputted as a logic low data bit OUT.

The illustrated RNVM cell having one transistor and two resistive MTJ elements, and the method for reading the RNVM cells nulls, or cancels, amplifier offset voltages resulting in more reliable read operations. Also, using one access transistor with two MTJ elements provides a more compact memory cell than a conventional array having two memory cells to provide differential sensing. In addition, read disturb is better controlled by controlling the reference voltage VR with an offset voltage ($\Delta$) across the resistive MTJ elements. The offset voltage ($\Delta$) is chosen to be small enough that the probability of disturbing the MTJ by inadvertently changing its resistance state is less than 1 in $10^{20}$. The relatively low probability of read disturb insures reliable read operation over the expected number of read operations.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   a plurality of bit lines and word lines including a first word line and a first bit line;
   an array of resistive non-volatile memory (RNVM) cells divided into a plurality of segments including a first segment coupled to the first word line, a first source line, and a second source line, wherein:
   each RNVM cell of the first segment is coupled to the first word line, the first source line, and the second source line;
   the first segment includes a first RNVM cell comprising a coupling transistor having a first current electrode coupled to a first bit line of the plurality of bit lines, a first RNVM element, and a second RNVM element having a first terminal coupled to a first terminal of the first RNVM element;
   the coupling transistor has a second current electrode coupled to the first terminals of the first and second RNVM elements;
   the first RNVM element having a second terminal coupled to the first source line; and
   the second RNVM element having a second terminal coupled to the second source line; and
   a sense amplifier having a capacitive input coupled to the first bit line.

2. The memory of claim 1, wherein the sense amplifier comprises:
   a first capacitor having a first terminal coupled to the first bit line;
   a first inverting amplifier having an input coupled to a second terminal of the first capacitor; and
   a first coupling device coupled between an output of the first inverting amplifier and the input of the first inverting amplifier.

3. The memory of claim 2, wherein a read operation of the memory has a calibration phase and a sense phase, wherein during the calibration phase the first coupling device couples the input of the first inverting amplifier to the output of the first inverting amplifier, and during the sense phase the coupling device decouples the input of the first inverting amplifier from the output of the first inverting amplifier.

4. The memory of claim 1, wherein a read operation of the memory comprises a calibration phase and sense phase, wherein the first and second source lines have a first voltage relationship during the calibration phase and a second voltage relationship during a sense phase, wherein:
the first relationship comprises one of a group consisting of the first and the second source lines are at a first voltage and the first source line is at a lesser voltage than the second source line; and
the second relationship comprises the first source line is at a greater voltage than the second source line.

5. The memory of claim 4, wherein, during the calibration phase, the first and second source lines and the first bit line are at a common voltage.

6. The memory of claim 4, wherein the first source line is at a lesser voltage than the second source line during the calibration phase; and the lesser voltage applied during the calibration phase is the same amount less than the first voltage is greater than the second source line in the sense phase.

7. The memory of claim 4, wherein the first word line is enabled during the calibration phase and during the sense phase.

8. The memory of claim 7, wherein the first RNVM cell is programmed to a first logic state by applying a high voltage programming voltage to the first and second source lines while applying a low voltage programming voltage to the first bit line while the coupling transistor is enabled in response to the first word line being enabled.

9. The memory of claim 8, wherein the first RNVM cell is programmed to a second logic state by applying the low voltage programming voltage to the first and second source lines while applying the high voltage programming voltage to the first bit line while the coupling transistor is enabled in response to the first word line being enabled.

10. The memory of claim 1, wherein the first and second RNVM elements comprise magnetic tunnel junctions in which program current flowing from the first terminal to the second terminal in the first RNVM element increases resistance of the first RNVM element and program current flowing from the first terminal to the second terminal of the second RNVM element decreases resistance of the second RNVM element.

11. The memory of claim 1, wherein voltages are supplied to the first and second source lines in response to the word line being enabled.

12. A method of operating a memory in which the memory comprises a word line, a bit line, a plurality of resistive non-volatile memory (RNVM) cells coupled to the word line, a first source line, and a second source line, wherein a first RNVM cell of the plurality of RNVM cells comprises a first RNVM element having a first terminal coupled to a common node, a second RNVM element having a first terminal coupled to the first RNVM element at the common node, and a coupling transistor coupled to the word line, the bit line, and the common node, the method comprising:
performing calibration on the first RNVM cell by applying a predetermined voltage condition on both a second terminal of the first RNVM element and a second terminal of the second RNVM element;
performing sensing on the first RNVM cell by applying a voltage differential across the second terminals of the first and second RNVM elements and using capacitive coupling to sense a change in voltage on the bit line to determine a logic state of the RNVM cell.

13. The method of claim 12, wherein the predetermined voltage condition defines a first polarity across the second terminals of the first and second RNVM elements and the applying the voltage differential across the second terminals establishes a voltage differential of a polarity opposite the first polarity.

14. The method of claim 13, wherein the predetermined voltage condition defines a first voltage differential between the second terminals of a first magnitude and the voltage differential of a polarity opposite the first polarity is established at the first magnitude.

15. The method of claim 14, wherein the voltage differential of the first magnitude provides a probability of programming that is lower than 1 in 10 to the twentieth.

16. The method of claim 12, wherein the performing the calibration comprises applying a common voltage to the common node and the second terminals of the first and second RNVM elements.

17. The method of claim 12, wherein the performing the sensing comprises:
achieving a trip point condition on an inverting amplifier; and
capacitively coupling the change in a bit line voltage to the inverting amplifier.

18. The method of claim 17, wherein the performing the calibration is in response to the word line being enabled and the performing the sensing is while the word line remains enabled.

19. A memory comprising:
a word line;
a bit line;
a plurality of resistive non-volatile memory (RNVM) cells coupled to the word line;
a first source line and a second source line;
wherein a first RNVM cell of the plurality of RNVM cells comprises:
a first RNVM element having a first terminal coupled to a common node and a second terminal coupled to the first source line;
a second RNVM element having a first terminal coupled to the first RNVM element at the common node and a second terminal coupled to the second source line; and
a coupling transistor coupled to the word line, the bit line, and the common node that couples the common node to the bit line during sensing; and
a sense amplifier capacitively coupled to the bit line to read a logic state of the first RNVM cell during sensing.

20. The memory of claim 19, wherein the sense amplifier comprises a capacitor coupled to the bit line, an inverting amplifier coupled to the capacitor, and a coupling device that establishes a trip point for the inverting amplifier.

* * * * *